(12) United States Patent
Rütten et al.

(10) Patent No.: US 7,521,683 B2
(45) Date of Patent: Apr. 21, 2009

(54) X-RAY DETECTOR

(75) Inventors: Walter Rütten, Linnich (DE); Augusto Nascetti, Rome (IT); Michael Overdick, Langerwehe (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 8 days.

(21) Appl. No.: 10/596,216

(22) PCT Filed: Dec. 2, 2004

(86) PCT No.: PCT/IB2004/052641

§ 371 (c)(1),
(2), (4) Date: Jun. 5, 2006

(87) PCT Pub. No.: WO2005/057659

PCT Pub. Date: Jun. 23, 2005

(65) Prior Publication Data

US 2007/0051894 A1  Mar. 8, 2007

(30) Foreign Application Priority Data

Dec. 10, 2003 (EP) .................................. 03104626

(51) Int. Cl.
*G01T 1/24* (2006.01)

(52) U.S. Cl. .............................. 250/370.08; 250/370.09

(58) Field of Classification Search ............ 250/370.09, 250/370.08

See application file for complete search history.

(56) References Cited

U.S. PATENT DOCUMENTS

| | | | | |
|---|---|---|---|---|
| 4,675,739 | A * | 6/1987 | Catchpole et al. ........... | 378/98.8 |
| 5,099,128 | A * | 3/1992 | Stettner .................. | 250/370.11 |
| 5,381,014 | A | 1/1995 | Jeromin et al. | |
| 5,804,832 | A | 9/1998 | Crowell et al. | |
| 5,886,353 | A * | 3/1999 | Spivey et al. .......... | 250/370.09 |
| 5,914,485 | A | 6/1999 | Kobayashi et al. | |
| 6,208,708 | B1 * | 3/2001 | Hoheisel et al. ............... | 378/37 |
| 6,403,964 | B1 * | 6/2002 | Kyyhkynen ............ | 250/370.09 |
| 6,510,195 | B1 * | 1/2003 | Chappo et al. ................ | 378/19 |

* cited by examiner

*Primary Examiner*—David P Porta
*Assistant Examiner*—Mark R Gaworecki

(57) ABSTRACT

The invention relates to a detector for an X-ray apparatus, which detector comprises a substrate (1) of amorphous or preferably crystalline silicon with an array (2) of sensor element (3) disposed thereon. Integrated electronic modules (4) having analog-digital converters disposed thereon are mounted on one edge (5) of the substrate (1) by flip-chip contacting or the like and are connected by way of signal leads (6) to the sensor elements. The modules (4) and/or the substrate can additionally comprise amplifiers and multiplexers for processing the sensor signals.

23 Claims, 1 Drawing Sheet

X-RAY DETECTOR

Figure 1:
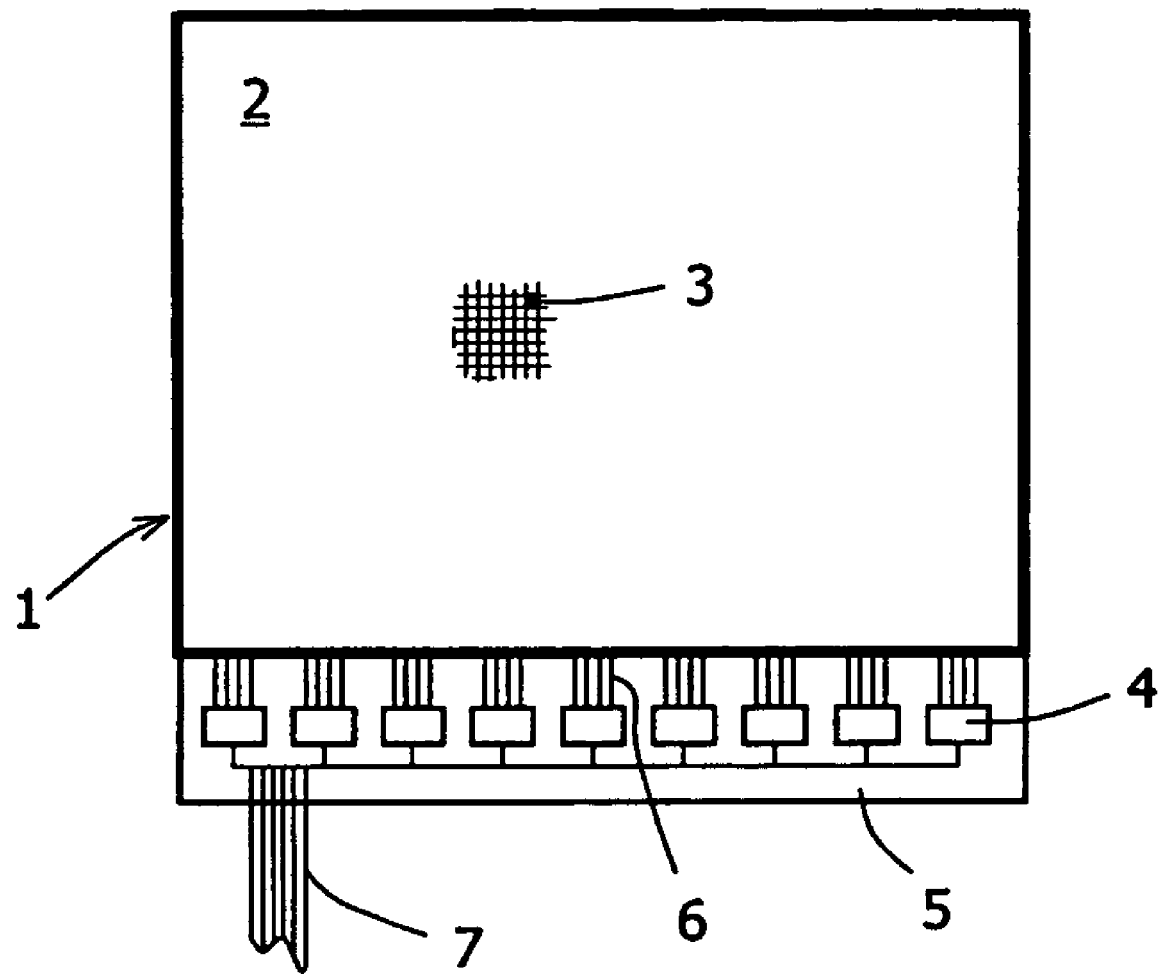

The invention relates to a detector for an imaging device, such as in particular an X-ray device.

Dynamic flat panel X-ray detectors (FDXD) are increasingly being used in the field of medical diagnostics as universal detector components that can be used in different application-specific X-ray apparatuses. They comprise an array of sensor elements (sensor matrix), each sensor element of the said array comprising an element for charge collection, for example, a photodiode or a capacitor, and at least one readout element, for example a thin-film transistor, for forwarding the collected charges to an evaluation circuit. Flat panel X-ray detectors are typically produced from amorphous silicon (a-Si:H), but could comprise crystalline silicon, which enables more complex and higher-capacity components to be realized.

Contacting of a large-area detector of the above-described kind is generally effected by means of so-called flex connections, that is to say, plastics foils with fine conductor paths, or by way of wire-bond connections. Because of the small line and column spacing of typically 50 to 250 μm and the large area of a sensor array, often several thousand connections have to be produced between the sensor matrix and downstream evaluating electronics. For detectors made of crystalline silicon, it is furthermore known that attempts have been made to integrate at least some of the evaluating electronics directly into the wafer that comprises the sensor matrix.

In addition, from U.S. Pat. No. 5,914,485 it is known in the case of a detector having an array of sensor elements to mount integrated electronic modules (ICs) for the addressing at one edge of the substrate and to mount integrated electronic modules for a multiplexing of the signals read out from the sensor elements at another edge.

Against this background, it was an object of the present invention to make available a detector with improved signal properties that is cost-efficient to manufacture.

That object is achieved by a detector having the features of claim 1 and by an imaging device having the features of claim 10. Advantageous embodiments are comprised in the subsidiary claims.

The inventive detector of an imaging device such as an X-ray arrangement or an optical imager comprises the following components:

a) A substrate, in which electronic circuits can be constructed. Typically, at least the regions of the substrate that comprise the electronics comprise amorphous or preferably crystalline silicon. Furthermore, the substrate can be applied to a mechanical support such as a glass plate, for example, or can comprise such a support.

b) An array of sensor elements, which are constructed on one side of the substrate. Typically, the sensor elements are here arranged in a regular pattern, for example, hexagonally or grid-form in lines and columns. The sensor elements are preferably sensitive to X-radiation and/or to visible light, producing an electrical signal corresponding to the amount of radiation absorbed.

c) At least one integrated electronic module (IC) for processing sensor signals, which is mounted, that is to say, is mechanically fixed, at one edge of the substrate. Typically, the electronic module is located on the same side of the substrate as the array of sensor elements. Furthermore, the electronic module is connected at its electrical input side by way of signal leads to the sensor elements, and it comprises at least one analog-digital converter for conversion of the analog input signals present on the signal leads into digital output signals. These digital output signals can then be passed by way of readout leads from the detector to further external evaluating circuits.

The detector has the advantage that it is possible for an analog-digital conversion of the signals of the sensor elements to take place directly at the edge of the array of sensor elements, thereby avoiding signal interference and noise caused by long external leads. Further advantages result from the fact that at least one separate integrated module that is fixedly connected to the substrate is provided. By this means, on the one hand a mechanically robust design is achieved, and on the other hand self-comprised manufacture and optimization both of the array of sensor elements and of the integrated module are rendered possible by the modular construction. Through a separate yield maximization and through separate tests for the integrated module, a higher overall yield and a reduction in costs can be achieved in manufacture.

In a preferred construction of the detector, the substrate comprises amplifiers for amplifying the sensor signals before these enter the integrated module as input signals. In this way, signal losses en route from the sensor elements to the integrated module are reduced, which is to the benefit of the signal quality. The electronics of the substrate are in this case advantageously realized by crystalline silicon.

Furthermore, the substrate can comprise analog multiplexers, which are connected upstream of the integrated module in order to reduce its input signals, and/or the substrate can comprise digital multiplexers, which are connected downstream of the integrated module to reduce the output signals of the detector.

According to another aspect of the detector, the integrated module comprises at least one amplifier for (pre)-amplification of the signals coming from the sensor elements. Furthermore, the integrated module can optionally comprise at least one multiplexer, by means of which a large number of input signals can be distributed in respect of time to a relatively small number of output lines. The integration of such a multiplexer therefore enables the number of external connections of the detector to be reduced.

The integrated module can comprise in particular crystalline silicon, which enables high-capacity circuits to be realized. Since the module is comparatively small in relation to the substrate of the detector, the use of crystalline silicon presents no problem. Moreover, the integrated module can be especially a CMOS circuit.

According to a preferred embodiment of the detector, the array of sensor elements extends at three sides of the substrate right to the edge. This means that only the side on which the at least one integrated module is located is not covered with the array of sensor elements. Such a construction of the detector extending in three directions with no edge strip enables a plurality of such detectors to be joined seamlessly to one another in order in this way to create larger detector areas. So that no edge of the substrate has to be used to accommodate an addressing circuit, the logic necessary for addressing the sensor elements is preferably integrated in the matrix of the sensor elements.

For the mechanical and electrical connection of the integrated module to the substrate, the methods of flip-chip contacting and wire-bonding or the mounting of "packaged ICs" (ICs in a housing) on a wafer are especially suitable.

The invention relates furthermore to an imaging device, which comprises a detector of the above-described kind. The imaging device can be in particular an X-ray arrangement, in which case the sensor elements of a directly converting detector are sensitive to X-radiation and of an indirectly converting detector are sensitive to scintillation light.

These and other aspects of the invention are apparent from and will be elucidated, by way of non-limitative example, with reference to the embodiment(s) described hereinafter.

In the drawings:

The FIGURE shows a view of a detector according to the invention.

The detector, shown schematically, can be in particular an optical imager or a dynamic flat panel X-ray detector (FDXD), or a module thereof. The detector comprises a rectangular, flat substrate 1, which comprises or comprises an electronic layer of amorphous or preferably crystalline silicon. The dimensions of the substrate 1 typically amount to 40 mm×40 mm to 500 mm×500 mm. On the top side of the substrate 1 visible in the FIGURE, there is a matrix or an array 2 of, for example, 2000×2000 sensor elements 3, the grid-form arrangement of which is indicated graphically. The array 2 extends in three directions as far as the edges of the substrate 1 at left, top and right in the FIGURE. The sensor elements 3 can comprise, for example, photodiodes and/or capacitors that accumulate electrical charges when irradiated with light or X-rays.

When a sensor element 3 is addressed by an addressing logic, not shown more specifically, distributed in the array 2, the charge signals of the sensor elements are applied line-wise to readout leads 6 running in the column direction. The readout leads 6 lead to the inputs of integrated electronic modules 4 (ICs), which are arranged at the free lower edge 5 of the substrate 1. The integrated modules 4 can comprise at least some of evaluating electronics, such as in particular amplifiers, analog-digital converters, multiplexers, interface-circuits and the like. Typically, a module 4 processes the signals of 50 to 500 signal leads 6. The size of the modules 4 can vary between a few square millimeters and a few square centimeters. The modules 4 preferably comprise crystalline silicon and are in the form of CMOS circuits.

The mechanical and electrical connection of the integrated modules 4 to the substrate 1 can be effected with a flip-chip technique (for example, ACF bonding, bump bonding or the like), with wire bonds or with packaged ICs (packaged ICs mounted on wafer). The connection of the integrated modules 4 to external evaluating electronics (not illustrated) is effected by means of flex connections 7.

In an especially preferred construction of the detector, the crystalline silicon electronics of the substrate 1 comprise amplifiers for amplifying the sensor signals. Here, a separate amplifier can be provided either for each individual sensor element 3 of the substrate or for each column lead 6. The integrated modules 4 then comprise primarily the analog-digital converters. The substrate 1 can furthermore additionally comprise analog multiplexers (connected upstream) and/or digital multiplexers (connected downstream).

Compared with detectors having evaluating electronics located completely outside the substrate, a detector of the above-described kind has the following advantages:

The number of connections (for example, flex bonds) leaving the substrate 1 can be significantly reduced by multiplexers in the modules 4.

A mechanically robust design is achieved.

The evaluating electronics comprised in the modules 4 lie very close to the sensor elements 3, which leads to a higher signal quality owing to reduced noise.

Compared with detectors having evaluating electronics integrated in the substrate, the following advantages are achieved:

Owing to the modular design, a self-comprised manufacture and optimization of the sensor matrix and integrated modules 4 is possible.

By separate yield-maximization and by separate tests of the modules 4, a production of the detectors with an overall higher yield and therefore at lower cost is possible.

A further advantage of the detector lies in the fact that the array of sensor elements 3 extends at three sides right to the outermost edge of the substrate 1. It is therefore possible to combine several detectors of this kind as it were seamlessly to form a larger detector area.

The invention claimed is:

1. A detector for an imaging device, comprising
   a) a substrate;
   b) an array of sensor elements, which is formed on one side of the substrate and extends along the one side of the substrate to three edges of the substrate;
   c) at least one integrated electronic module for processing sensor signals, the module being mounted at one edge of the substrate and being connected at its input side to the sensor elements, and the module comprising at least one analog-digital converter for conversion of analog input signals into digital output signals, wherein the module is mounted on the same side of the substrate as the array of sensor elements.

2. The detector as claimed in claim 1, wherein the substrate comprises amplifiers for amplifying the input signals of the integrated module.

3. The detector as claimed in claim 1, wherein the substrate comprises at least one of one or more multiplexers connected upstream of the integrated module and one or more multiplexers connected downstream of the integrated module.

4. The detector as claimed in claim 1, wherein the integrated module comprises at least one of one or more amplifiers for amplifying the input signals and one or more multiplexers.

5. The detector as claimed in claim 1, wherein the integrated module is manufactured from crystalline silicon.

6. The detector as claimed in claim 1, wherein the integrated module is connected to the substrate by at least one of flip-chip contacting, wire-bonding and mounting of packaged ICs on a wafer.

7. The detector as claimed in claim 1, wherein the substrate comprises electronics of crystalline or amorphous silicon.

8. The detector as claimed in claim 1, wherein the sensor elements are sensitive to X-radiation and/or visible light.

9. The detector of claim 1, further comprising a plurality of amplifiers, wherein the array of sensor elements is positioned in columns, wherein each of the columns has a readout lead, and wherein each readout lead is connected to one amplifier of the plurality of amplifiers.

10. The detector of claim 1, further comprising a plurality of flexible connections downstream of the modules for connecting the modules to remote electronics.

11. An imaging device comprising: a detector having a substrate, an array of sensor elements, and at least one integrated electronic module for processing sensor signals, wherein the array of sensor elements is formed on only one side of the substrate and extends to all but one edge of the substrate, wherein the module is mounted at the one edge of the substrate and is connected at an input side of the module to the sensor elements.

12. The imaging device of claim 11, wherein the detector has a plurality of amplifiers, wherein the array of sensor elements is positioned in columns, wherein each of the columns has a readout lead, and wherein each readout lead is connected to one amplifier of the plurality of amplifiers.

13. The imaging device of claim 11, wherein the detector has a plurality of flexible connections downstream of the modules for connecting the modules to remote electronics.

14. The imaging device of claim 11, wherein the detector has one or more analog multiplexers connected upstream of the integrated module and one or more digital multiplexers connected downstream of the integrated module.

15. The imaging device of claim 11, wherein the electronic module includes at least one analog-to-digital converter for converting analog signals from the sensor elements into digital output signals.

16. The imaging device of claim 11, wherein the electronic module is mounted on the same side of the substrate as the array of sensor elements.

17. The imaging device of claim 11, wherein the detector comprises more than four detectors with edges of each substrate, other than the one edge on which the module is mounted, abutting each other.

18. A detector for an imaging device, comprising:
  a) a substrate;
  b) an array of sensor elements positioned in columns, each column having a read out lead, which array is formed on one face of the substrate;
  c) at least one integrated electronic module for processing sensor signals, the module being mounted at one edge of the substrate, the module including:
    one or more analog multiplexers connected to the readout leads, at least one analog-to-digital converter connected with the analog multiplexers for conversion of analogous input signals on the readout leads into digital output signals,
    at least one amplifier connected with one of the readout leads and the analog-to-digital converter, and
    one or more digital multiplexers connected downstream of the at least one amplifier and the analog-to-digital converter,
  wherein the module is mounted on the same face of the substrate as the array of sensor elements.

19. A method of forming a detector for an imaging device, the method comprising:
  providing a substrate;
  positioning an array of sensor elements along a first side of the substrate, wherein the array extends to all but one edge of the substrate;
  providing one or more integrated electronic modules having analog-digital converter for conversion of analog input signals into digital output signals;
  positioning one or more integrated electronic modules for processing sensor signals on the one edge of the substrate along the first side of the substrate; and
  connecting an input of each of the modules to one or more of the sensor elements.

20. The method of claim 19, comprising:
  positioning a plurality of amplifiers on the first side of the substrate;
  positioning the array of sensor elements in columns;
  connecting a readout lead to each of the columns; and
  connecting each read out lead to an amplifier of the plurality of amplifiers.

21. The method of claim 19, further comprising:
  positioning one or more analog multiplexers upstream of the module on the first side of the substrate; and
  positioning one or more digital multiplexers downstream of the module on the first side of the substrate.

22. The method of claim 19, further comprising:
  providing a plurality of flexible connections downstream of the modules on the first side of the substrate for connecting the modules to remote electronics.

23. A detector for an imaging device, comprising
  a) a substrate;
  b) an array of sensor elements, which is formed on one face of the substrate;
  c) at least one integrated electronic module for processing sensor signals, the module being mounted at one edge of the substrate and being connected at its input side to the sensor elements, and the module comprising at least one analog-to-digital converter for conversion of analog input signals into digital output signals,
  wherein the module is mounted on the same face of the substrate as the array of sensor elements, and
  wherein logic for addressing the sensor elements is integrated into the array of sensor elements such that no edge of the substrate is used to accommodate an addressing circuit.

* * * * *